(12) United States Patent
Van Bilsen

(10) Patent No.: US 7,271,907 B2
(45) Date of Patent: Sep. 18, 2007

(54) LITHOGRAPHIC APPARATUS WITH TWO-DIMENSIONAL ALIGNMENT MEASUREMENT ARRANGEMENT AND TWO-DIMENSIONAL ALIGNMENT MEASUREMENT METHOD

(75) Inventor: Franciscus Bernardus Maria Van Bilsen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 390 days.

(21) Appl. No.: 11/019,529

(22) Filed: Dec. 23, 2004

(65) Prior Publication Data

US 2006/0139642 A1 Jun. 29, 2006

(51) Int. Cl.
*G01B 11/00* (2006.01)

(52) U.S. Cl. .......................... 356/401; 430/22; 430/30; 355/77

(58) Field of Classification Search ........ 356/399–401, 356/620–622; 355/53, 55, 77; 250/548
See application file for complete search history.

(56) References Cited

U.S. PATENT DOCUMENTS

| 6,537,728 B2 | 3/2003 | Michiels et al. |
| 6,768,539 B2* | 7/2004 | Gui et al. ...................... 355/53 |
| 2002/0176082 A1* | 11/2002 | Sakakibara et al. ......... 356/400 |

FOREIGN PATENT DOCUMENTS

| EP | 1 324 136 A1 | 7/2003 |
| EP | 1 400 859 A2 | 3/2004 |

OTHER PUBLICATIONS

Kazuya Ota, et al., "New Alignment Sensors for Wafer Stepper", SPIE, vol. 1463, Optical/Laser Microlithography IV (1991), pp. 304-314.
Nigel R. Farrar, et al., "Performance of through-the-lens/off-axis laser alignment systems and alignment algorithms on Nikon wafer steppers", SPIE vol. 1673, Integrated Circuit Metrology, Inspection and Process Control VI (1992), pp. 369-380.
Translation of Taiwanese Office Action issued in Taiwan Patent Application No. 094143896 dated Mar. 19, 2007.

* cited by examiner

*Primary Examiner*—Tarifur Chowdhury
*Assistant Examiner*—Tara S Pajoohi
(74) *Attorney, Agent, or Firm*—Pillsbury Winthrop Shaw Pittman LLP

(57) ABSTRACT

A lithographic apparatus having an actuator to move an object with a mark that includes a plurality of structures arranged in rows and columns. An alignment arrangement has a light source, optics and a detector. The light source and the optics produce an alignment beam with a first spot portion extending in a first direction that is parallel to the columns and a second spot portion extending in a second direction that is parallel to the rows. The optics direct the alignment beam to the mark, receive alignment radiation back from the mark and transmit the alignment radiation to the detector. The detector transmits an alignment signal to a processor that calculates a two-dimensional position of the mark based on the alignment signal.

25 Claims, 6 Drawing Sheets

LITHOGRAPHIC APPARATUS WITH TWO-DIMENSIONAL ALIGNMENT MEASUREMENT ARRANGEMENT AND TWO-DIMENSIONAL ALIGNMENT MEASUREMENT METHOD

FIELD OF THE INVENTION

The present invention relates to a lithographic apparatus with a two-dimensional alignment arrangement and a two-dimensional alignment measurement method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) of a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

K. Ota, e.a., New Alignment Sensors for Wafer Stepper, SPIE, Vol. 1463, Optical/Laser Microlithography IV (1991), p. 304-314, and N. R. Farrar, e.a., Performance of through-the-lens/off-axis laser alignment systems and alignment algorithms on Nikon wafer steppers, SPIE Vol. 1673, Integrated Circuit Metrology, Inspection, and Process Control VI (1992), p. 369-380, disclose a laser step alignment (LSA) arrangement. In such a laser step alignment arrangement marks are used, including a plurality of square shaped structures arranged in rows and columns. A laser produces an elongated alignment measurement spot on the square shaped structures in a column. The incoming alignment beam is diffracted by the mark and a number of diffraction orders are generated and transmitted back to a detector. The zero-th diffraction order may be blocked before it hits the detector. The detector may generate a detector signal for a processor that determines the location of the mark column irradiated with the spot. By directing the spot to all columns consecutively and measuring the location of all columns in this way, the measured locations of the columns can be averaged and the location of the mark may be determined.

In this set-up, one such mark is used to measure a position of the mark in a first direction. To measure a position in another, second direction, e.g., perpendicular to the first direction, a further mark is provided that is scanned in the second direction. In general, marks may be provided in scribelanes on a substrate, extending in a x-direction and marks in scribelanes extending in an y-direction. Thus, to perform an alignment measurement in the x-direction and in the y-direction, the marks in the x-scribelanes and the y-scribelanes should be moved such that they may be measured consecutively by the alignment measurement arrangement used. However, such movement cost time. Moreover, these marks occupy costly space in the scribelanes which may be also used for all kinds of electrical test circuits.

SUMMARY

It is desirable to provide a lithographic apparatus arranged to perform an improved alignment measurement.

To that end, in a first embodiment, the invention provides a lithographic apparatus that includes an alignment beam generator that includes the optics and produces an alignment beam having an alignment beam spot with a first alignment beam spot portion extending in a first direction and a second alignment beam spot portion extending in a second direction that is substantially perpendicular to the first direction; a projection system that directs the alignment beam onto the at least one mark on the object; beam directing optics that receive alignment radiation back from the at least one mark and direct the alignment radiation to the detector; an actuator that is adapted to move the object relative to the alignment beam; a processor that is connected to the actuator and the detector, and arranged to: control the actuator during use so that the columns of structures of the at least one mark and the rows of structures of the at least one mark, respectively, receive the first alignment beam spot portion and the second alignment beam spot portion, respectively; receive the alignment signal from the detector; and calculate a two-dimensional position of the at least one mark based on the alignment signal. In another embodiment, the invention may be adapted to perform immersion lithography. In a further embodiment, the invention relates to a reticle with a mark pattern that includes a plurality of structures arranged in rows and columns.

In a still further embodiment, the present invention relates to an object with an alignment mark the at least one mark pattern comprising a plurality of structures arranged in rows and columns, the rows being arranged at predetermined row pitches, wherein at least a first row pitch is different from a second row pitches and wherein the columns are arranged at predetermined column pitches, wherein at least a first column pitch is different from a second column pitch.

In a still further embodiment, the present invention relates to a blocking device that includes a plate with a plurality of holes thereon, which are arranged to pass one or more first higher diffraction orders of said first diffraction pattern and one or more second higher diffraction orders of said second diffraction pattern.

Moreover, the present invention provides an alignment measurement method that includes producing an alignment beam with an alignment beam spot having a first alignment beam spot portion extending in a first direction and a second alignment beam spot portion extending in a second direction that is substantially perpendicular to said first direction; directing said alignment beam to at least one mark on an object, said at least one mark having a plurality of structures arranged in rows and columns; scanning said first alignment beam spot portion across said columns of structures of said at least one mark and scanning said second alignment beam spot portion across said rows of structures of said at least one mark; receiving alignment radiation back from said at least one mark; producing an alignment signal based on said alignment radiation; and calculating a two-dimensional position of said at least one mark based on said alignment signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
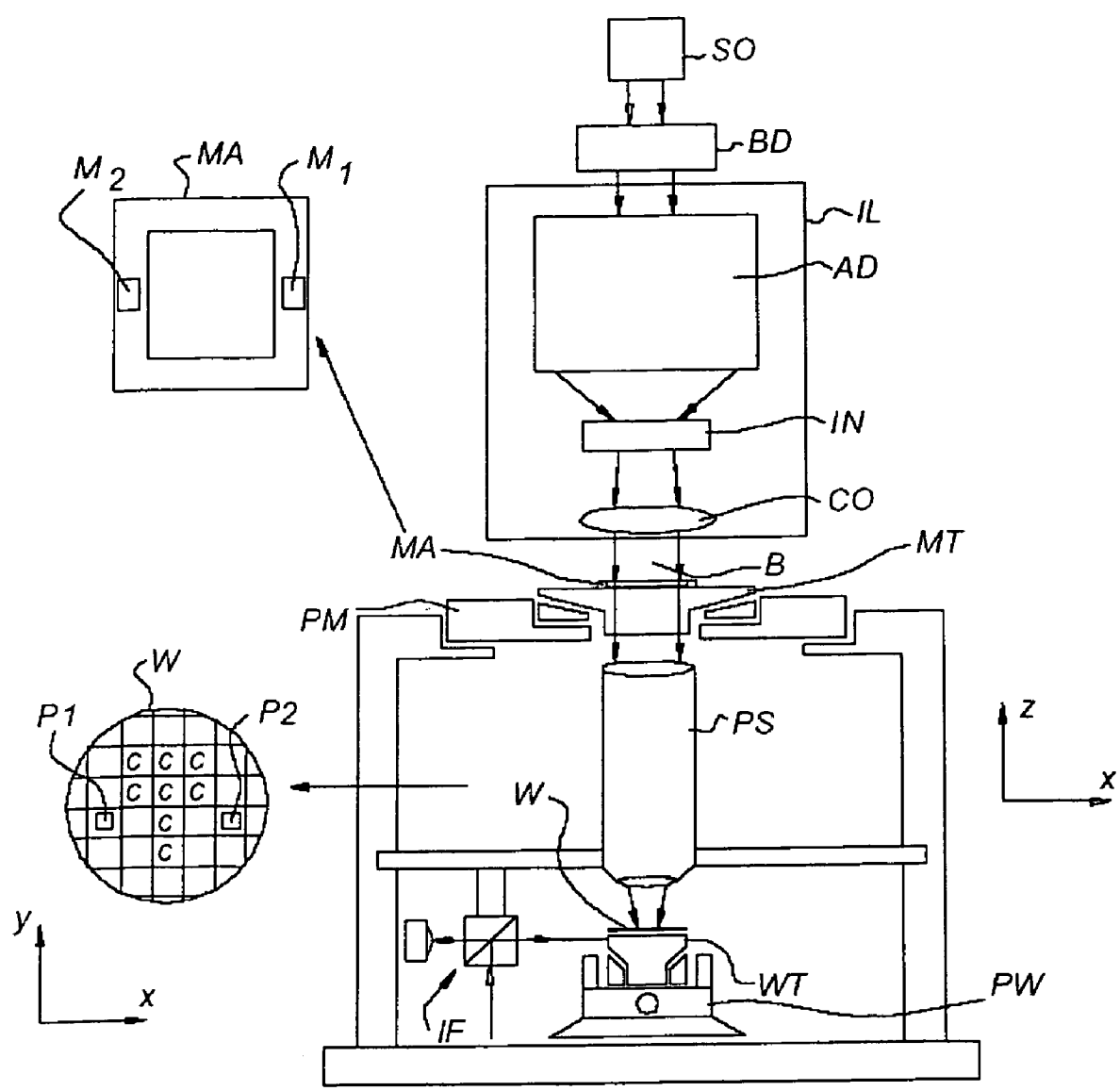
FIG. 1 depicts a lithographic apparatus according to an embodiment of the invention.

FIG. 1 schematically depicts a lithographic apparatus according to one embodiment of the invention. The apparatus includes:

- an illumination system (illuminator) IL configured to condition a radiation beam B (e.g. UV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not suggest that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
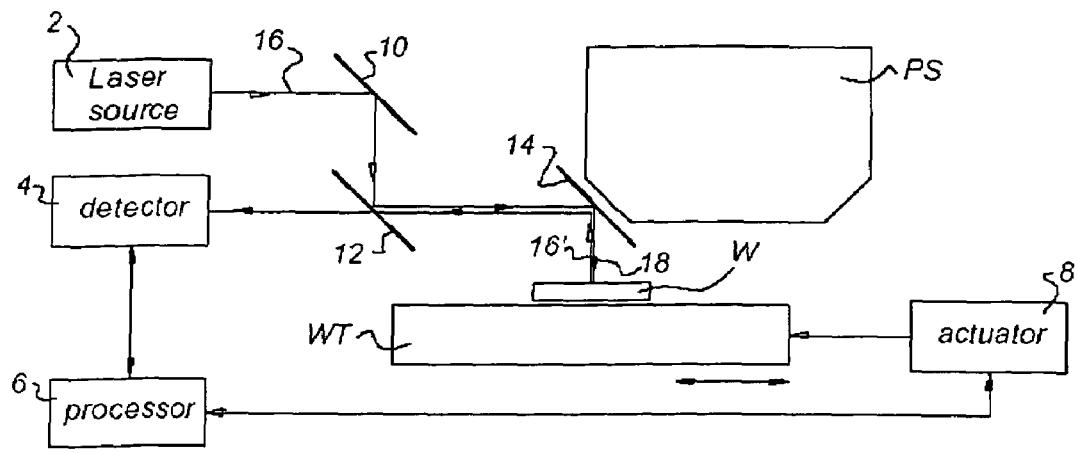
FIG. 2 depicts a schematic diagram of a laser step alignment arrangement.

FIG. 2 shows an example of a laser step alignment arrangement. The arrangement shown in FIG. 2 comprises a laser source 2, a mirror 10, a semi transparent mirror 12, a mirror 14, a detector 4, and a processor 6. Also shown in FIG. 2 are the projection system PS, the substrate W and the substrate table WT, as well as an actuator 8.

In use, the laser source 2 generates a laser beam 16 that is directed to the mirror 10. The mirror 10 reflects the laser beam 16 to the semi-transparent mirror 12. The laser beam 16 as reflected by the semi-transparent mirror 12 is directed to the mirror 14. The laser beam 16 reflected by the mirror 14 is directed as an alignment beam 18 to a mark M1 (cf. FIG. 3) on substrate W. The alignment beam 18, as received by the mark M1, is diffracted by the mark M1 as diffracted radiation 16' back to the mirror 14. The mirror 14 reflects the diffracted radiation 16' to semi-transparent mirror 12. The mirror 12 is semi transparent and passes a portion of the diffracted radiation 16' to the detector 4. The detector 4 receives the portion of the diffracted radiation 16' and generates an output signal for processor 6.

The actuator 8 shown in FIG. 2 is intended to illustrate that the substrate table WT may be moved to such a position that the mark M1 can be aligned with the alignment beam 18. Moreover, the actuator 8 is arranged to move the substrate table WT to allow exposing of the substrate W by exposure light through the projection system PS, as is known to persons skilled in the art. The actuator 8 is controlled by processor 6. Of course, in practice, there may be more than one actuator to allow movement of the substrate table WT in a plurality of directions. It is noted that the processor 6 is shown as one single processor unit connected to both the detector 4 and the actuator 8. However, if desired, multiple, different functions of the processor 6 may be implemented in different processors. These processors need not necessarily be within the lithographic apparatus but may be located outside the lithographic apparatus.

Figure 3:
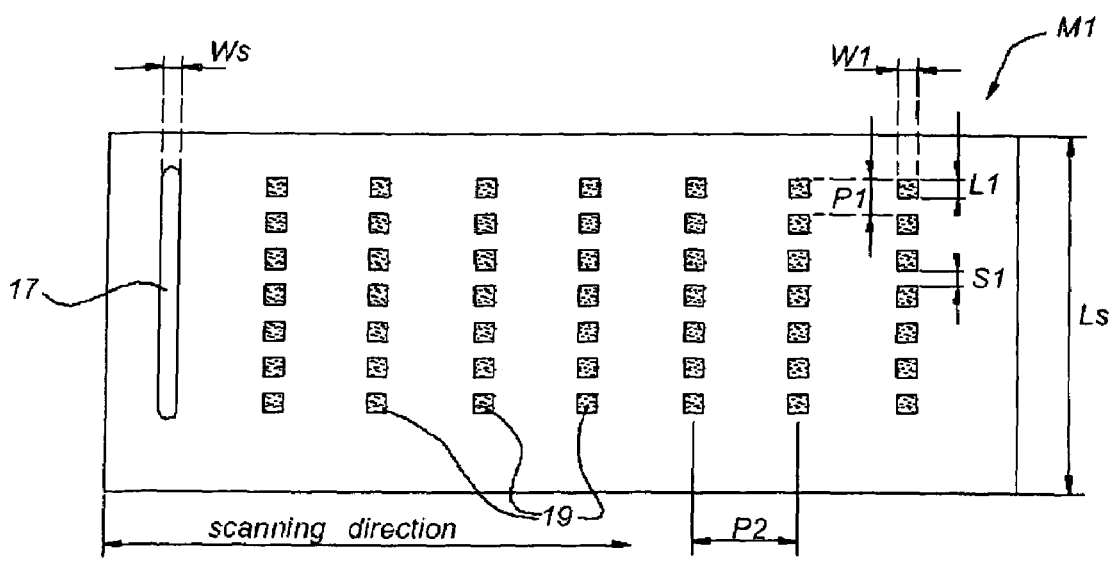
FIG. 3 shows a mark that may be used in the laser step alignment arrangement of FIG. 2.

FIG. 3 shows an example of a mark M1 that can be located on the substrate W for alignment purposes. However, the mark M1 can also be located on the substrate table WT or any other object to be aligned.

FIG. 3 is a top view of the mark M1. The mark comprises a plurality of square shaped structures 19 arranged in rows and columns. The square shaped structures 19 are made of a material or a structure that is distinguishable from its surroundings. In one embodiment of the invention, the square shaped structures 19 may be portions that are either higher or lower than the surface of the remainder of the mark M1. Instead of square shaped structures 19, other shapes may be used. The square shaped structures 19 may have a length L1 and a width W1. Adjacent square shaped structures within a column have a pitch P1 whereas intermediate distances between adjacent square shaped structures within a column are referred to with S1. Adjacent square shaped structures 19 in rows have a pitch P2.

The alignment beam 18 is indicated to have a substantially rectangular shaped spot 17 with a width Ws and a length Ls. In the embodiment shown, the position of the alignment beam spot 17 is fixed. The mark M1 can be moved in a direction perpendicular to the columns of the mark M1 in a scanning direction as indicated in FIG. 3. By moving the mark M1 in the scanning direction, the alignment beam spot 17 can be located above the square shaped structures 19 within one column. Movement is done by actuator 8.

In one embodiment, the following values may be used:

W1=L1=4 µm;

P1=8 µm;

S1=4 µm;

P2=20 µm

Ws=2 µm

Ls=70 µm

However, other values may be used, as desired.

When the alignment beam spot 17 is directed to one of the columns of square shaped structures 19, as shown in FIG. 3, a diffraction pattern results with a plurality of orders, as is known to persons skilled in the art.

Figure 4:
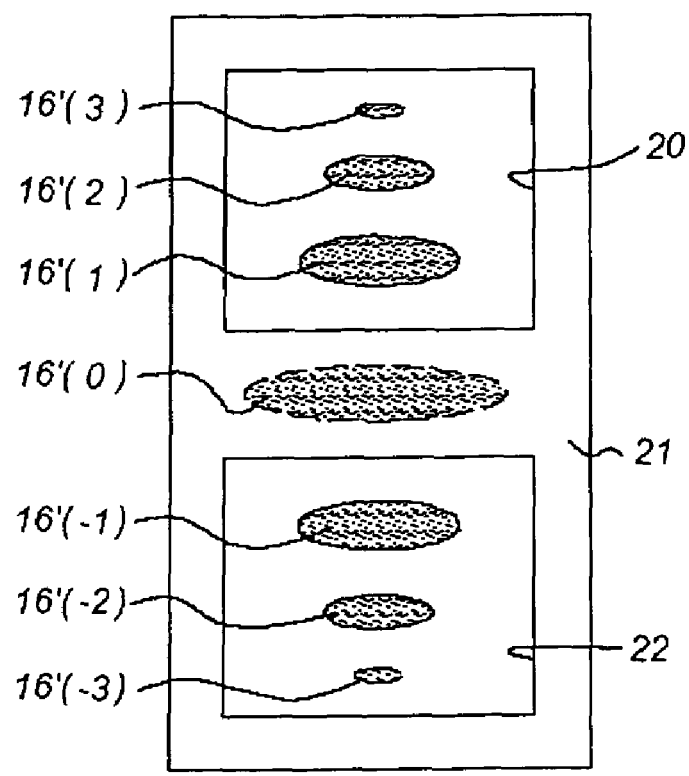
FIG. 4 shows an example of alignment radiation transmitted by a mark in the alignment arrangement of FIG. 2 and a plate for passing part of that radiation.

FIG. 4 shows a cross section through such a diffraction pattern. FIG. 4 shows the following orders of the diffraction pattern of the alignment radiation diffracted by the mark M1: $16'(i)$ (i=−3, −2, −1, 0, 1, 2, 3, where i=diffraction order). The diffraction order $16'(0)$ is shown with dotted lines. The reason is that FIG. 4 also shows a plate 21 with two holes 20, 22. The plate 21 may be arranged such that only the orders $16'(i)$, i=−3, −2, −1, 1, 2, 3 are able to pass the holes 20, 22. The diffraction order $16'(0)$ may be blocked by plate 21. The diffraction orders $16'(i)$, i=−3, −2, −1, 1, 2, 3 are directed to the detector 4.

Figure 5:
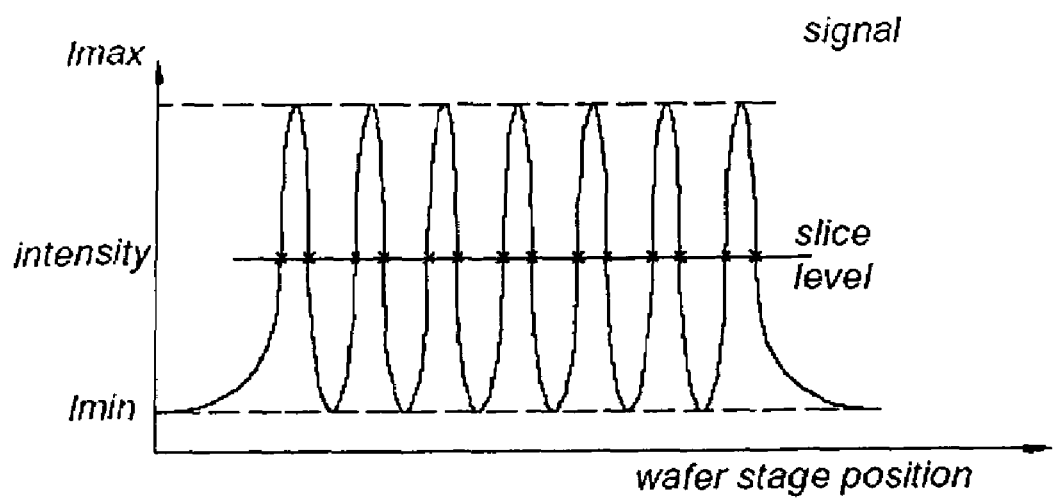
FIG. 5 shows an output signal of a detector receiving the alignment radiation as shown in FIG. 4.

FIG. 5 shows an output signal of the detector 4 when receiving the diffraction orders $16'(i)$, i=−3, −2, −1, 1, 2, 3. The light intensities of the received diffracted orders may be integrated by the detector 4. When the holes 20, 22 are passing the diffraction orders 16(i), i=−3, −2, −1, 1, 2, 3, as much as possible, the output signal of the detector 4 will have a maximum value of Imax. When the substrate table WT is moved in the scanning direction, the intensity of the output signal of detector 4 is reduced until a minimum value of Imin, when the alignment beam spot 17 is predominantly illuminating the area between the square shaped structures 19 limiting diffraction intensity. When the substrate table WT moves further in the scanning direction the intensity of the output signal of detector 4 will increase again until the diffraction orders $16'(i)$, i=−3, −2, −1, 1, 2, 3 of a next column of square shaped structures 19 is received by the detector 4. This pattern will be repeated until all columns of square shaped structures 19 have been detected by the detector 4. It is observed that the periodic nature of the signal, as shown in FIG. 5, has on optimal signal to noise ratio when the zero order $16'(0)$ is blocked by the plate 21.

The signal of FIG. 5, as received by the processor 6, may be used by the processor 6 to align the object on which the mark M1 is located. To that end various algorithms can be used as is known to persons skilled in the art. For example, the positions of the columns of square shaped structures 19 as shown in FIG. 3 and as derived from the signal shown in FIG. 5 may be averaged to arrive at a better estimation of the location of mark M1.

The invention will be explained with reference to a laser step alignment system, of which an example has been illustrated with reference to FIGS. 2-5. However, the invention is also applicable with other types of alignment setups, e.g., in a setup with a so-called "Athena" sensor. This alignment sensor measures a position of an alignment mark. During alignment, the alignment mark is illuminated with an alignment beam of radiation. The alignment beam of radiation is diffracted by the alignment mark into several diffraction orders such as +1, −1, +2 and −2. Using optical elements, each set of corresponding diffraction orders (say +1 and −1) may be used to form an image of the alignment mark onto a reference plate. The reference plate may comprise reference gratings for each set of corresponding diffraction orders to be measured. Behind each reference grating a separate detector may be arranged to measure the intensity of the radiation in the image passing through the reference gratings. By moving the alignment mark relative to the reference plate, the position with the highest intensity for one or more images may be found, which gives the aligned position.

To enhance performance, the intensity of several images may be measured and the alignment beam of radiation may consist of multiple colours.

Use of other types of sensors is not excluded, including sensors based on capacitive or acoustic measurement principles.

Figure 6:
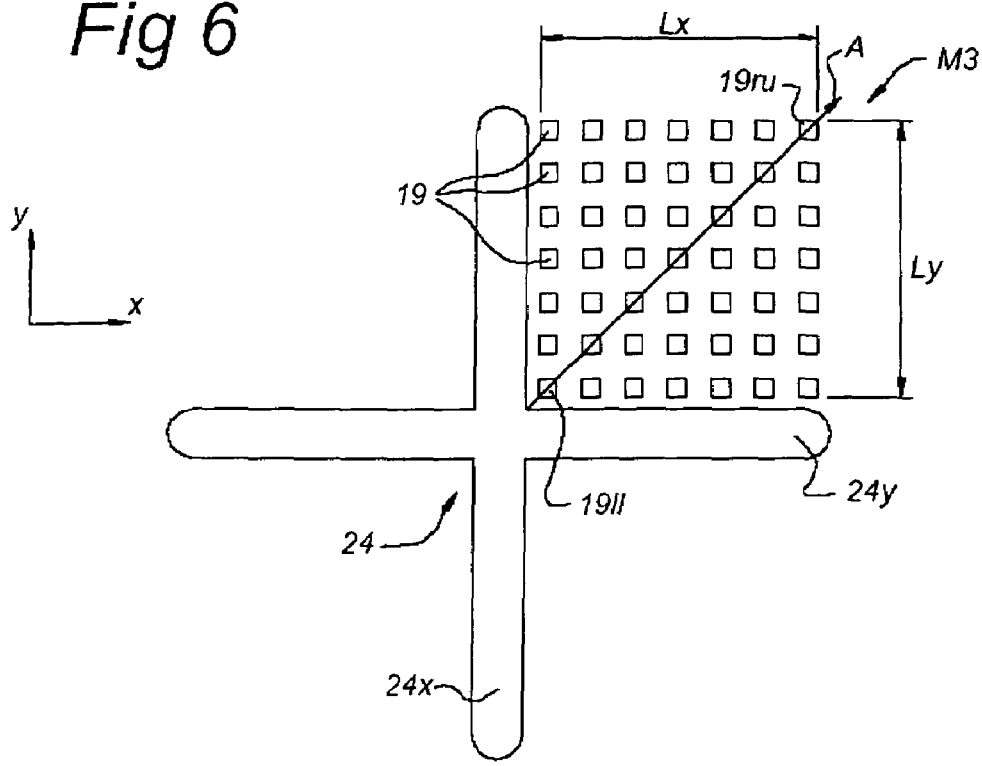
FIG. 6 shows a schematic example of an alignment beam measurement spot that can be used to perform a two-dimensional alignment measurement on a single alignment mark.

FIG. 6 shows a schematic view of mark M3 and an alignment beam spot 24 in accordance with an embodiment of the invention. The alignment beam spot 24 has two portions, a first spot portion 24x extending in an y-direction but to be used to measure subsequent columns of mark M3 in a x-direction, and a second spot portion 24y extending in the x-direction but to be used to measure subsequent rows of mark M3 in the y-direction.

During use, in a first embodiment, mark M3 may be moved by actuator 8, as controlled by processor 6, such that the alignment beam spot 24 moves diagonally relative to mark M3, as indicated by arrow A in FIG. 6. In FIG. 6, the situation is shown that the alignment beam spot 24 moves relative to the mark M3 from a left lowest square shaped structure 19ll to a right most upper square shaped structure 19ru. Moreover, the spot portions 24x, 24y are shown to comprise elongated bar shaped cross sections where spot portion 24x has a length about twice as large as a length Ly of mark M3 in the y-direction, and spot portion 24y has a length about twice as large as a length Lx of mark M3 in the x-direction. Moreover, in the embodiment shown, spot portions 24x, 24y intersect one another substantially in their respective centers. Lengths Lx and Ly, respectively, correspond with lengths of a row and a column, respectively.

When moving spot 24 and mark M3 relative to one another as indicated with arrow A, all square shaped structures 19 of mark M3 may be irradiated by spot 24 during subsequent measurement actions. In one embodiment, all square shaped structures 19 in each column may be irradiated once by alignment beam spot portion 24x and all square shaped structures 19 in each row may be irradiated once by alignment beam spot portion 24y.

Although preferred, the lengths of alignment beam spot portions 24x and 24y, respectively, are not necessarily twice as large (or larger) as the mark lengths Ly and Lx, respectively. Shorter lengths may be sufficient. One desired condition is that sufficient radiation intensity is present in diffracted orders higher than the zero-th diffraction order such that detector 4 receives sufficient light intensity to generate a valid signal to processor 6.

It will be evident to the persons skilled in the art that the diffraction orders passing through the holes 20 and 22 may depend on the size and the pitch of the square shaped structures. The invention is not limited to situations in which diffraction orders 16'(i), i=−3, −2, −1, 1, 2, 3 are directed to the detector 4. Less or more diffraction orders 16'(i) directed to the detector 4 are also within the scope of this invention.

Figure 7:
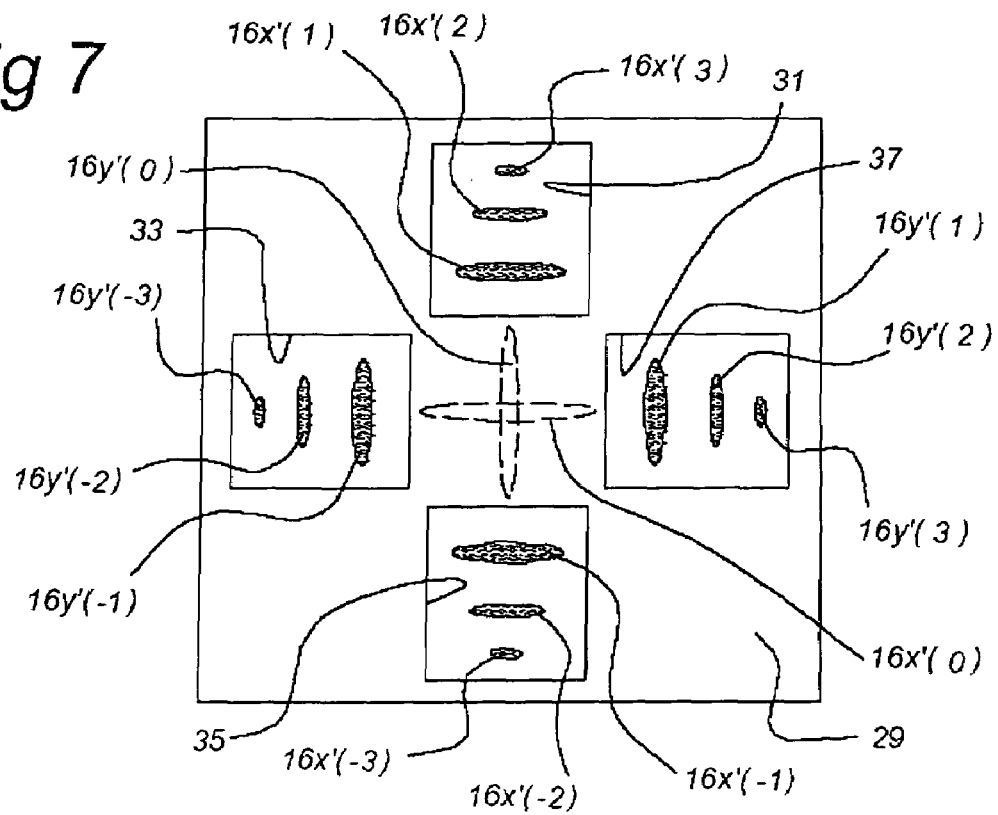
FIG. 7 shows a blocking device; coarse mark, respectively.

There are several options to block the zero-th diffraction orders caused by the alignment beam spot portions 24x, 24y, and to pass only one or more higher diffraction orders to the detector 4. FIG. 7 shows a plate 29 to be used in one embodiment of the invention. The plate 29 comprises four holes 31, 33, 35, 37. The spot portions 24x and 24y, respectively, generate diffraction pattern orders 16x'(i) and 16y'(i), respectively, when these spot portions 24x and 24y, respectively, are directed to a column and a row, respectively, of square shaped structures 19. Note that the intensity of these diffraction pattern orders need not be equally strong in the column and row directions at the same time. It may well be that the spot portion 24x hits a column of square shaped structures 19 whereas, conveniently, the spot portion 24y hits an area adjacent to a row of square shaped structures 19, or vice versa.

The detector 4 should be arranged to receive diffraction orders 16x'(i) and 16y'(i) separately and to send a first detection signal relating to diffraction orders 16x'(i) to processor 6, and a second detection signal relating to diffraction orders 16y'(i) to processor 6. Both the first and second detection signal may have a form as shown in FIG. 5.

Figure 10:
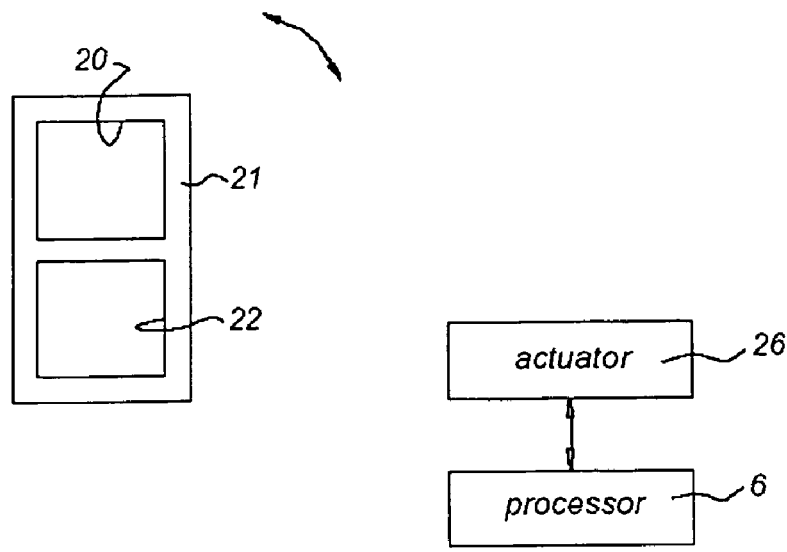
FIGS. 10 and 11 show alternative blocking devices for blocking a diffraction order of a diffraction pattern.

Alternatively, it is possible to rotate the plate 21 back and forth about 90° by an actuator 26 controlled by processor 6, as shown in FIG. 10. The actuator 26 may be connected to plate 21 by suitable connecting devices (not shown). Rotating may be done when alignment beam spot portion 24x is impinging on a column and alignment beam spot portion 24y is impinging on a row at the same time. However, it may alternatively be possible to move spot 24 and mark M3 relative to one another such that any time alignment beam spot portion 24x is impinging on a column that alignment beam spot portion 24y is, then, impinging on a mark portion adjacent to one or between two rows, and vice versa. Then, the diffracted orders may alternatively, during the movement, originate from alignment beam spot portion 24x and alignment beam spot portion 24y.

By rotating the plate 21 about 90° consecutively with actuator 26, the detector 4 will transmit a detector signal to processor 6 similar to the one shown in FIG. 5, but the consecutive maximum values Imax will relate consecutively to rows and columns of mark M3. The plate 21 may be rotated about 90° as controlled by processor 6 any time processor 6 has detected a maximum value Imax. A control signal may then be generated by processor 6 and sent to actuator 26 arranged to rotate plate 21.

Figure 11:
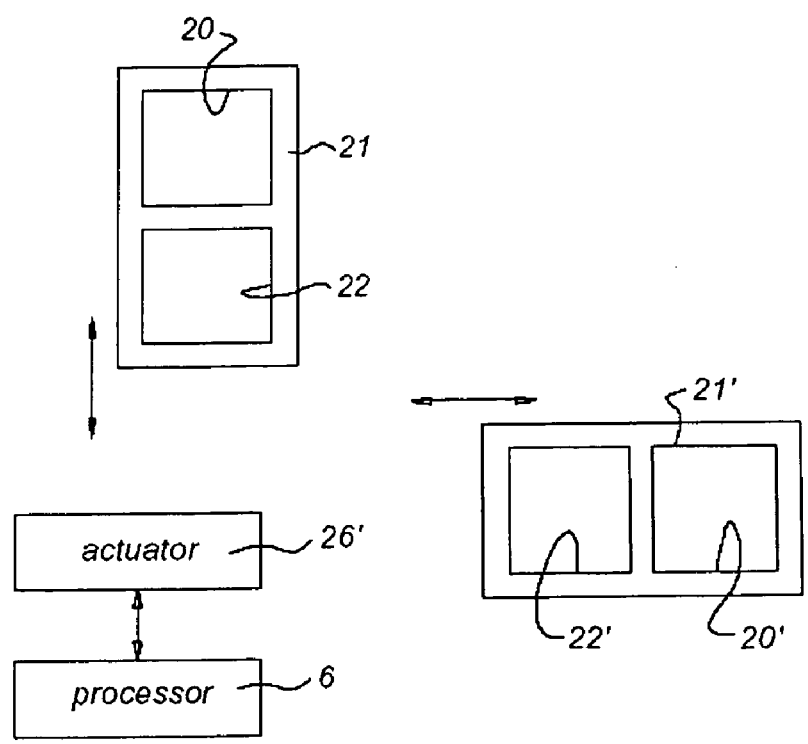

In an alternative arrangement, shown in FIG. 11, the plate 21 may not be rotated, but the measurement arrangement comprises two plates 21 and 21', both shaped like plate 21 but one plate 21 having its holes 20, 22 adjacent to one another in the y-direction as shown in FIG. 4, and the other plate 21' having holes 20' and 22' adjacent to one another in the x-direction. These plates 21, 21' may, then, be driven by an actuator 26' to interrupt consecutively the zero-th diffraction orders of the diffraction orders caused by alignment beam spot portions 24x and 24y, respectively. The actuator 26' is connected to the plates 21, 21' with suitable connecting devices (not shown) and controlled by processor 6.

In an alternative embodiment, the alignment beam spot portions 24x, 24y are not generated at the same time but may be generated alternately in time. This may be done by two alternately driven laser sources where one of them generates alignment beam spot portion 24x and the other one generates alignment beam spot portion 24y. However, in a further alternative, this may be done by using a single laser source with differently shaped shutters one with a slit in one direction and one in another, perpendicular direction and driven to be alternately in the laser beam of the laser source. In yet another embodiment, a beam splitter may be used in combination with two beam shaping objects and frequency modulators. Other embodiments may be used.

It will be evident to persons skilled in the art that the relative movement between spot 24 and mark M3 need not follow a straight line as indicated by arrow A. The relative movement may be step-like, both in the x-direction and the y-direction, respectively, with a step size of one or more columns and rows, respectively. In its most simple form such a step like movement may result in, first, all columns being measured with alignment beam spot portion 24x by a relative movement in the x-direction, as shown in and explained with reference to FIG. 3, and then all rows being measured with alignment beam spot portion 24y by a relative movement in the y-direction, or vice versa. In the latter case, the alignment beam spot portion 24x may have a length equal to Ly and alignment beam spot portion 24y may have a length equal to Lx. Moreover, when applying this step-like movement, the sets of diffraction orders radiated by mark M3 may not alternately originate from alignment beam spot portions 24x and 24y. There may be another order of origin, e.g., there may be first two sets of diffraction orders originating from alignment beam spot portion 24x, then two sets from alignment beam spot portion 24y, etc.

In the embodiment shown, mark M3 may include as many square shaped structures in the x-direction as in the y-direction. However, these numbers may vary and may be different in directions x and y. Moreover, the sizes of the square shaped structures 19, as well as the pitches, may be different for the x and y-direction. The structures may have other shapes, if desired.

Figure 8A:
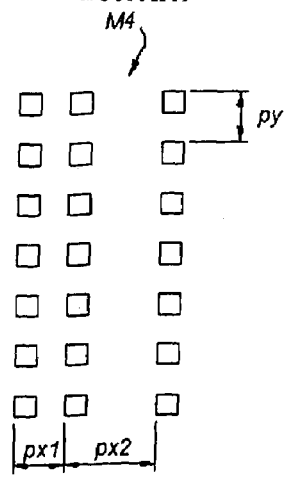
FIG. 8a shows an example of a prior art one-dimensional course mark.
Figure 8B:
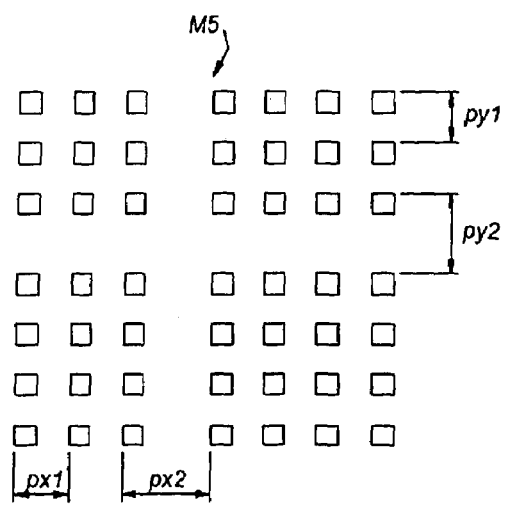
FIG. 8b shows an example of a two-dimensional course mark.

FIG. 8a shows a prior art coarse mark M4, whereas FIG. 8b shows a coarse mark M5 according to the invention. Both marks M4 and M5 may include a plurality of square shaped structures arranged in columns and rows. Mark M4 includes a pitch Py in the y-direction that is equal for all rows, but has a different pitch Px2 between two adjacent columns that differs from other pitches Px1 between other adjacent columns. As known to persons skilled in the art, mark M4 may be used to perform a coarse alignment since it produces alignment radiation resulting in a signal of detector 4 similar to the one shown in FIG. 5, but having two adjacent maximum values at another mutual distance than other mutual distances in the signal. This may provide the processor 6 with the option to perform a coarse identification of the two columns adjacent to the space with larger pitch Px2.

FIG. 8b shows mark M5 that includes one (or more) different pitch(es) Px2 in the x-direction and one (or more) pitches Py2 in the y-direction, which differ from other pitches Py1 in the y-direction. Thus, mark M5 provides the alignment arrangement of FIG. 2 with the option to perform a coarse alignment in both the x-direction and the y-direction.

As observed with respect to mark M3, mark M5 may have rectangle shaped structures with different sizes and pitches in the x-direction and y-direction. Moreover, the number of columns need not be necessarily the same as the number of rows. In alternative embodiments, structures other than square or rectangle shaped structures may be used.

Figure 9:
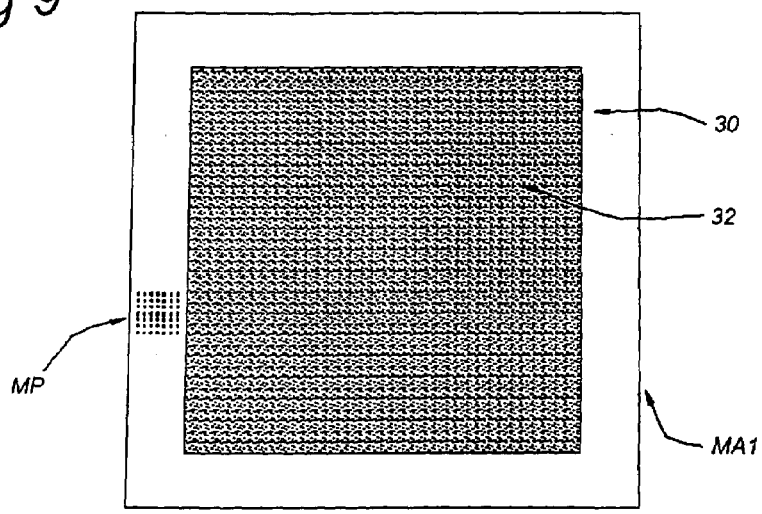
FIG. 9 shows a reticle with mark patterns.

As will be evident to persons skilled in the art, the marks M3 and M5 may be made on the object, e.g., a substrate or substrate table, by an exposure process in a lithographic apparatus. To that end, a reticle with suitable mark patterns is used in such a lithographic apparatus. FIG. 9 shows such a reticle MA1 with one or more mark patterns MP in a schematic way. The one or more mark patterns MP are located in a reticle scribelane 30 that corresponds with scribelanes in the x-direction and y-direction on substrate W and are projected with the apparatus shown in FIG. 1 on the substrate W in a way known to persons skilled in the art. FIG. 8 shows that reticle MA1 may include a reticle area 32 that corresponds with a structure to be imaged on a die area on a substrate W as is known to persons skilled in the art.

Although the arrangement as shown with reference to FIG. 2 shows that actuator 8 moves substrate table WT so as to create a movement of alignment beam 18 across substrate W, it should be understood that alignment beam 18 may be moved by suitable devices, e.g., by a mirror actuated to sweep alignment beam 18, and thus spot portions 24x, 24y across substrate W, whereas, then, the substrate table WT and thus substrate W would remain on a fixed location.

Although specific reference maybe made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography or immersion lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may have been made above to the use of embodiments of the invention in the context of top side alignment, it will be appreciated that the invention may be used in applications where the alignment marks are located at the bottom side of the wafer.

Although specific reference may have been made above to the use of embodiments with specific alignment mark dimensions, it will be appreciated that mark dimension adjustments which reduce the sensitivity of the alignment mark to certain processes, like CMP (chemical mechanical polishing), PVD (physical vapor deposition), or etching may be made without departing the scope of the invention.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. A lithographic apparatus configured to receive an object having at least one mark that includes a plurality of structures arranged in rows and columns, the lithographic apparatus including an alignment arrangement comprising a light source, optics and a detector, the light source being arranged for producing a light beam, the optics being arranged for receiving the light beam, and the detector being arranged to produce an alignment signal, the lithographic apparatus comprising:

an alignment beam generator that includes the optics and produces an alignment beam having an alignment beam spot with a first alignment beam spot portion extending in a first direction and a second alignment beam spot portion extending in a second direction that is substantially perpendicular to the first direction;

a projection system that directs the alignment beam onto the at least one mark on the abject;

beam directing optics that receive alignment radiation back from the at least one mark and direct the alignment radiation to the detector;

an actuator that is adapted to move the object relative to the alignment beam;

a processor that is connected to the actuator and the detector, and arranged to:

control the actuator during use so that the columns of structures of the at least one mark and the rows of structures of the at least one mark, respectively, receive the first alignment beam spot portion and the second alignment beam spot portion, respectively;

receive the alignment signal from the detector, and calculate a two-dimensional position of the at least one mark based on the alignment signal.

2. The lithographic apparatus according to claim 1, wherein said columns have a column length and said rows have a row length, and said light source and said optics are arranged to produce said alignment beam spot such tat said first alignment beam spot portion has a first length larger than said column length, but smaller than or equal to two times said column length, and said second alignment beam spot portion has a second length larger than said row length, but smaller than or equal to two times said row length.

3. The lithographic apparatus according to claim 2, wherein said first and second alignment beam spot portions intersect one another.

4. The lithographic apparatus according to claim 1, wherein said actuator is arranged such that, during use, said alignment beam spot moves substantially diagonally across said at least one mark.

5. The lithographic apparatus according to claim 1, wherein said columns have a column length and said rows have a row length, and said light source and said optics are arranged to produce said alignment beam spot such that said first alignment beam spot portion has a first length substantially equal to said column length and said second alignment beam spot portion has a second length substantially equal to said row length.

6. The lithographic apparatus according to claim 5, wherein said first alignment beam spot portion has a first end portion and said second alignment beam spot portion has a second end portion, and said first and second end portion touch one another.

7. The lithographic apparatus according to claim 1, wherein said alignment radiation comprises a first zero-th diffraction order of a first diffraction pattern caused by said first alignment beam spot portion and a second zero-tb diffraction order of a second diffraction pattern caused by said second alignment beam spot portion, and said lithographic apparatus further comprises a blocking device arranged to block both said first and said second zero-th diffraction orders.

8. The lithographic apparatus according to claim 7, wherein said blocking device comprises a plate with a plurality of holes thereon, which are arranged to pass one or more first higher diffraction orders of said first diffraction pattern and one or more second higher diffraction orders of said second diffraction pattern.

9. The lithographic apparatus according to claim 7, wherein said blocking device comprises a plate with a plate portion and an actuator arranged to rotate said blocking device such that said first and second zero-th diffraction orders are consecutively blocked by said plate portion.

10. The lithographic apparatus according to claim 7, wherein said blocking device comprises a first plate with a first plate portion and a second plate with a second plate portion, and an actuator arranged to move said first and second plates such that said first and second zero-th diffraction orders are consecutively blocked.

11. The lithographic apparatus according to claim 1, wherein said actuator is arranged to move said object such that said alignment beam spot moves step-like across said at least one mark, both in said first direction and in said second direction.

12. The lithographic apparatus according to claim 2, wherein said alignment beam spot first moves in said first direction to irradiate all columns and secondly moves in said second direction to irradiate all rows.

13. The lithographic apparatus according to claim 1, wherein said mark is a two-dimensional coarse mark and said processor is arranged to calculate a coarse two dimensional position based on said alignment signal.

14. The lithographic apparatus according to claim 1, wherein the object is a substrate having a top side that is exposed by the lithographic apparatus and a bottom side that includes at least one mark.

15. The lithographic apparatus according to claim 1, wherein the object is a reticle.

16. The lithographic apparatus according to claim 15, wherein the rows of the plurality of structures are arranged at predetermined row pitches, wherein at least a first row pitch is different from a second row pitch and wherein the columns are arranged at predetermined column pitches, wherein at least a first column pitch is different from a second column pitch.

17. The lithographic apparatus according to claim 15, wherein the plurality of structures include structures that have a rectangular shape or a square shape.

18. The lithographic apparatus according to claim 1, wherein the alignment mark comprising the plurality of structures that are arranged in rows and columns include rows that are arranged at predetermined row pitches, wherein at least one row pitch is different from another row pitch and columns that are ranged at predetermined column pitches, at least one column pitch being different from another column pitch.

19. The lithographic apparatus according to claim 1, wherein the plurality of structures include structures that have a rectangular shape or a square shape.

20. The lithographic apparatus according to claim 19, wherein the alignment mark is located on a bottom side of the object.

21. The lithographic apparatus according to claim 7, wherein the blocking device comprises a plate with a plurality of holes therein, the holes being arranged in a first set and a second set, the holes in the first set being arranged on a first line and the holes in the second set being arranged on a second line, the first and second line being perpendicular to one another, the plate have a plate portion at an intersection point of the first and second lines for blocking radiation.

22. A lithographic apparatus configured to receive a substrate having at least one mark that includes a plurality of structures arranged in rows and columns, the lithographic apparatus including an alignment arrangement comprising a light source, optics and a detector, the light source being arranged for producing a light beam, the optics being arranged for receiving the light beam and producing an alignment beam, and the detector being arranged to produce an alignment signal, the lithographic apparatus comprising:
  an illumination system configured to condition a radiation beam;
  a support structure that supports a patterning device, the patterning device being capable of imparting the radiation beam with a pattern in its cross-section to Loan a patterned radiation beam;
  a pattern generating system configured to project the patterned radiation beam onto a target portion of a substrate;
  an alignment beam generator that includes the optics and produces an alignment beam having an alignment beam spot with a first alignment beam spot portion extending in a first direction and a second alignment beam spot portion extending in a second direction that is substantially perpendicular to the first direction;
  a projection system that directs the alignment beam onto the at least one mark on the substrate, the at least one mark having a plurality of structures arranged in rows and columns;

beam directing optics that receive alignment radiation back from the at least one mark and direct the alignment radiation to the detector;

an actuator that is adapted to move the substrata relative to the alignment beam; and a processor that is coupled to the actuator and the detector, and arranged to:

control the actuator such that, daring use, the columns of structures of the at least one mark and the rows of structures of the at least one mark, respectively, receive the first alignment beam spot portion and the second alignment beam spot portion, respectively;

receive the alignment signal from said the detector; and calculate a two-dimensional position of the at least one mark based on the alignment signal.

23. An alignment measuring method in a lithographic apparatus, comprising:

producing an alignment beam with an alignment beam spot having a first alignment beam spot portion extending in a first direction and a second alignment beam spot portion extending in a second direction that Is substantially perpendicular to said first direction;

directing said alignment beam to at least one mark on an object, said at least one mark having a plurality of structures arranged in rows and columns;

scanning said first alignment beam spot portion across said columns of structures of said at least one mark and scanning said second alignment beam spot portion across said rows of structures of said at least one mark;

receiving alignment radiation back from said at least one mark;

producing an alignment signal based on said alignment radiation; and calculating a two-dimensional position of said at least one mark based on said alignment signal.

24. The method as claimed in claim 23, further comprising:

providing a patterned radiation beam onto a target portion of the object; and manufacturing a device from said object.

25. A computer program product comprising data and instructions to be loaded by a processor of a lithographic apparatus, and arranged to allow said lithographic apparatus to perform the alignment measurement method comprising:

producing an alignment beam with an alignment beam spot having a first alignment beam spot portion extending in a first direction and a second alignment beam spot portion extending in a second direction that is substantially perpendicular to said first direction;

directing the alignment beam to at least one mark on an object, said at least one mark having a plurality of structures arranged in rows and columns;

scanning the first alignment beam spot portion across said columns of structures of said at least one mark and scanning the second alignment beam spot portion across the rows of structures of the at least one mark;

receiving alignment radiation back from the at least one mark;

producing an alignment signal based on the alignment radiation; and calculating a two-dimensional position of the at least one mark based on the alignment signal.

* * * * *